(12) United States Patent
Lim

(10) Patent No.: US 7,911,751 B2
(45) Date of Patent: Mar. 22, 2011

(54) ELECTROSTATIC DISCHARGE DEVICE WITH METAL OPTION ENSURING A PIN CAPACITANCE

(75) Inventor: Dong Ju Lim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 114 days.

(21) Appl. No.: 12/324,074

(22) Filed: Nov. 26, 2008

(65) Prior Publication Data

US 2009/0135535 A1    May 28, 2009

(30) Foreign Application Priority Data

Nov. 26, 2007  (KR) .................. 10-2007-0121024

(51) Int. Cl.
*H02H 3/22* (2006.01)

(52) U.S. Cl. .......................................... 361/56; 361/111

(58) Field of Classification Search .................... 361/56, 361/111; 257/355–360
See application file for complete search history.

(56) References Cited

U.S. PATENT DOCUMENTS

2009/0014801 A1* 1/2009 Chen et al. .................. 257/357
* cited by examiner

*Primary Examiner* — Danny Nguyen
(74) *Attorney, Agent, or Firm* — Ladas & Parry LLP

(57) ABSTRACT

The present invention discloses an electrostatic discharge device for ensuring a pin capacitance using a metal option. The electrostatic discharge device includes an electrostatic discharging unit formed between a power source voltage line and a ground voltage line to discharge static electricity input from a pad. A MOS capacitor of the electrostatic discharge device has a gate terminal connected to the pad via a metal option. A protection unit is formed between the electrostatic discharging unit and the ground voltage line to protect an internal circuit from static electricity stored in the electrostatic discharging unit.

8 Claims, 8 Drawing Sheets

ELECTROSTATIC DISCHARGE DEVICE WITH METAL OPTION ENSURING A PIN CAPACITANCE

CROSS-REFERENCE TO RELATED APPLICATIONS

The present application claims priority to Korean patent application number 10-2007-0121024 filed on Nov. 26, 2007, which is incorporated herein by reference in its entirety.

BACKGROUND OF THE INVENTION

The present invention relates generally to a semiconductor device, and more particularly, to an electrostatic discharge device that is capable of protecting a semiconductor device from static electricity and ensuring a pin capacitance using a metal option.

Generally, a semiconductor device has an electrostatic discharge device provided between an input/output pad and an internal circuit. The electrostatic discharge device performs an electrostatic discharge operation to protect the internal circuit of the semiconductor device from static electricity that is induced.

If the static electricity is induced within the semiconductor device, the static electricity concentrates and flows to the most vulnerable portion within the semiconductor device. As a result of the concentrated static electricity, failures such as junction, contact, or melting of the gate oxide may occur at the internal circuit of the semiconductor device. Therefore, the input/output pad of the semiconductor device is provided with the electrostatic discharge device to protect the internal circuit from the static electricity.

Currently, semiconductor chips are required to be capable of being operated at high speeds. Accordingly, a pin capacitance and its margin tend to be reduced, which results in increased difficulty in optimizing a pin capacitance characteristic.

Further, the semiconductor device is gradually being implemented in a smaller area. However, since semiconductor devices such as a Synchronous Dynamic (SD) RAM or a Double Date Rate (DDR) RAM requires a higher capacitance, it is difficult to implement the semiconductor devices in a smaller area while satisfying a demand for the higher capacitance.

General methods for addressing the above-mentioned problems include, a method of applying a gate oxide capacitor having a high capacitance relative to the area surrounding the pad formed in the semiconductor device for the electrostatic discharge device, or a method of modifying a package routing pattern of the semiconductor device to use a package capacitance of the semiconductor device for the electrostatic discharge device.

In particular, all of the devices used for the electrostatic discharge device such as a diode, a MOS transistor, or a Silicon Controlled Resistor (SCR), have a characteristic dependent upon the junction capacitance, and therefore have a capacitance which is considerably low.

Therefore, the electrostatic discharge device needs to be designed having sufficient capacitance while also being capable of being implemented in a smaller area.

FIG. 1 is a diagram showing an example of an electrostatic discharge circuit according to the prior art.

The electrostatic discharge circuit of the prior art shown in FIG. 1 includes an electrostatic discharging unit 10 for discharging the static electricity externally applied to a power source voltage Vcc line or a ground voltage Vss line, a protection unit 20 for protecting a gate oxide film of the input buffer 40, i.e., the internal circuit, from being destroyed due to charges stored in the discharging unit 10, a capacitor unit 30 for preventing excessive voltage from being applied to a gate to protect the oxide film from being destroyed, and an input buffer 40, i.e., the internal circuit, to which a signal is applied through a pad PAD.

The electrostatic discharging unit 10 includes a PMOS discharging diode 11 and an NMOS discharging diode 12 for discharging the static electricity induced at the pad PAD to a power source voltage Vcc line or a ground voltage Vss line, and a PMOS diode 13 and an NMOS diode 14 for adjusting a discharging capacity. The PMOS diode 13 and the NMOS diode 14 are connected to a node that is connected to the PAD by a metal option 15. The metal option 15 can be connected to the node connected to the pad PAD or cut to disconnect the node connected to the pad PAD to adjust the discharging capacity of the electrostatic discharging unit 10.

The protection unit 20 includes a resistance element R connected in series between the pad PAD and the input buffer 40, and an NMOS diode 21 connected to the resistance element R. The NMOS diode 21 is connected in parallel to the input buffer 40. The NMOS diode 21 is turned on to protect the gate oxide film from being destroyed if current due to the static electricity induced to the electrostatic discharging unit 10 abruptly flows.

The capacitor unit 30 includes a PMOS capacitor 31 connected to the power source Vcc line and an NMOS capacitor 32 connected to the ground voltage Vss line.

The MOS capacitors 31, 32 are connected to a rear portion of the resistor element R of the discharging unit 20, i.e., between the discharging unit 20 and the input buffer 40, and is responsible for diminishing excessive voltage applied to the input buffer 40 due to the static electricity. The MOS capacitors 31, 32 are responsible for protecting the gate oxide film of the input buffer 40 from being destroyed and also used for ensuring the pin capacitance. That is, where the specified pin capacitance cannot be ensured with diodes of the electrostatic discharging unit, the capacitor unit 30 is used for ensuring the pin capacitance.

However, there is a problem in that the overall chip size of the semiconductor device increases since all the pins of the semiconductor device must be formed with the capacitor to ensure the pin capacitance.

SUMMARY OF THE INVENTION

The present invention provides a semiconductor device capable of reducing a chip size while ensuring a pin capacitance.

Further, the present invention provides a MOS capacitor having a metal option using a multi-finger structure to ensure the pin capacitance.

The electrostatic discharge device according to an embodiment of the present invention comprises a electrostatic discharging unit formed between a power source voltage line and a ground voltage line to discharge static electricity inputted from a pad and including a MOS capacitor of which a gate terminal is coupled to the pad via a metal option; and a protection unit formed between the electrostatic discharging unit and the ground voltage line to protect an internal circuit from the static electricity stored in the electrostatic discharging unit.

The MOS capacitor comprises a first capacitor of which a source and a drain are coupled to the power source voltage line and a second capacitor of which a source and a drain are coupled to the ground voltage line.

Preferably, the first capacitor is a PMOS capacitor and the second capacitor is an NMOS capacitor.

The first capacitor and the second capacitor are formed having a finger structure.

The CDM unit comprises a resistance element coupled to the pad and an NMOS transistor coupled to the resistance element and the ground voltage line.

The gate can be coupled to a drain of the NMOS transistor via the metal option.

The electrostatic discharge device according to the present invention can easily ensure the pin capacitance without increasing the chip size.

Further, according to the present invention, it is possible to prevent the gate oxide film from being destroyed due to the static electricity by forming the couplion node of the metal option on a rear portion of the resistance element of the discharging unit.

DESCRIPTION OF SPECIFIC EMBODIMENTS

Hereinafter, preferred embodiments of the present invention will be described in detail with reference to the accompanying drawings.

Figure 1:
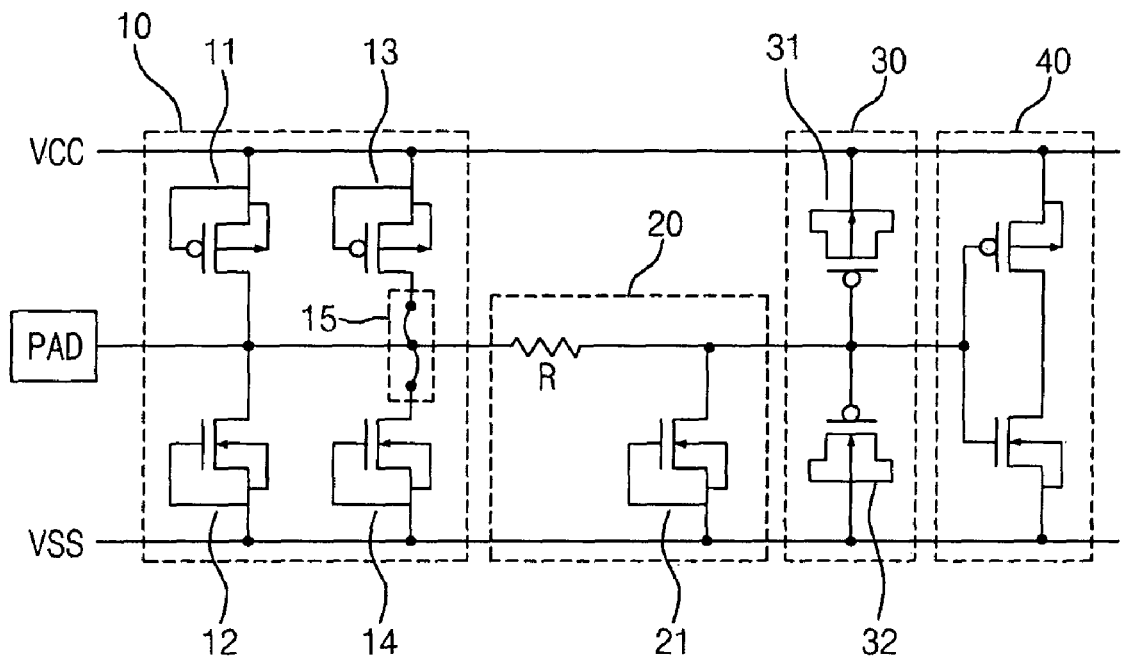
FIG. 1 is a structural diagram showing an electrostatic discharge device according to the prior art.
Figure 2:
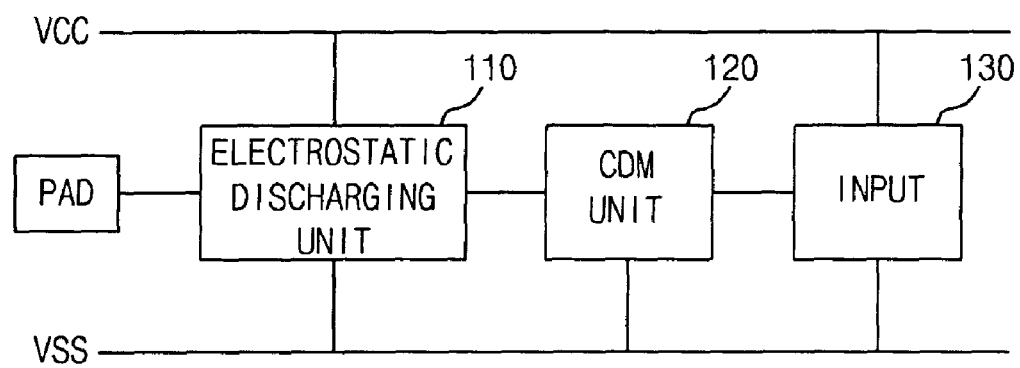
FIG. 2 is a block diagram illustrating an electrostatic discharge device according to the present invention.

FIG. 2 shows a block diagram illustrating an embodiment of electrostatic discharge device according to the present invention.

The electrostatic discharge device of FIG. 2 includes an electrostatic discharging unit 110, a protection unit 120, and an input buffer 130 as an internal circuit. The electrostatic discharge device includes the electrostatic discharging unit 110 and protection unit 120 to prevent the internal circuit from being damaged due to excessive currents caused by static electricity externally induced through a pad PAD.

The electrostatic discharging unit 110 is provided between a power source Vcc line and a ground voltage Vss line to discharge the static electricity induced from the pad PAD to the voltage lines. The electrostatic discharging unit 110 is formed with capacitors 113, 114 (as shown in FIG. 3) to ensure the pin capacitance.

The protection unit 120 protects a gate oxide film of a MOS transistor within the input buffer 130 from being destroyed due to a discharge operation of electric charges stored in the electrostatic discharging unit 110. The protection unit 120 is provided between the electrostatic discharging unit 110 and the input buffer 30 and preferably provided between a node connected to the pad PAD and the ground voltage Vss line.

The input buffer 130 is responsible for transferring the input signal and has a pullup transistor and a pulldown transistor structured complementarily to each other. In the input buffer 130, the pullup transistor is connected to the power source Vcc line and the pulldown transistor is connected to the ground voltage Vss line. According to an embodiment of the present invention, the input buffer 130 represents the internal circuit protected by the electrostatic discharge device.

Figure 3:
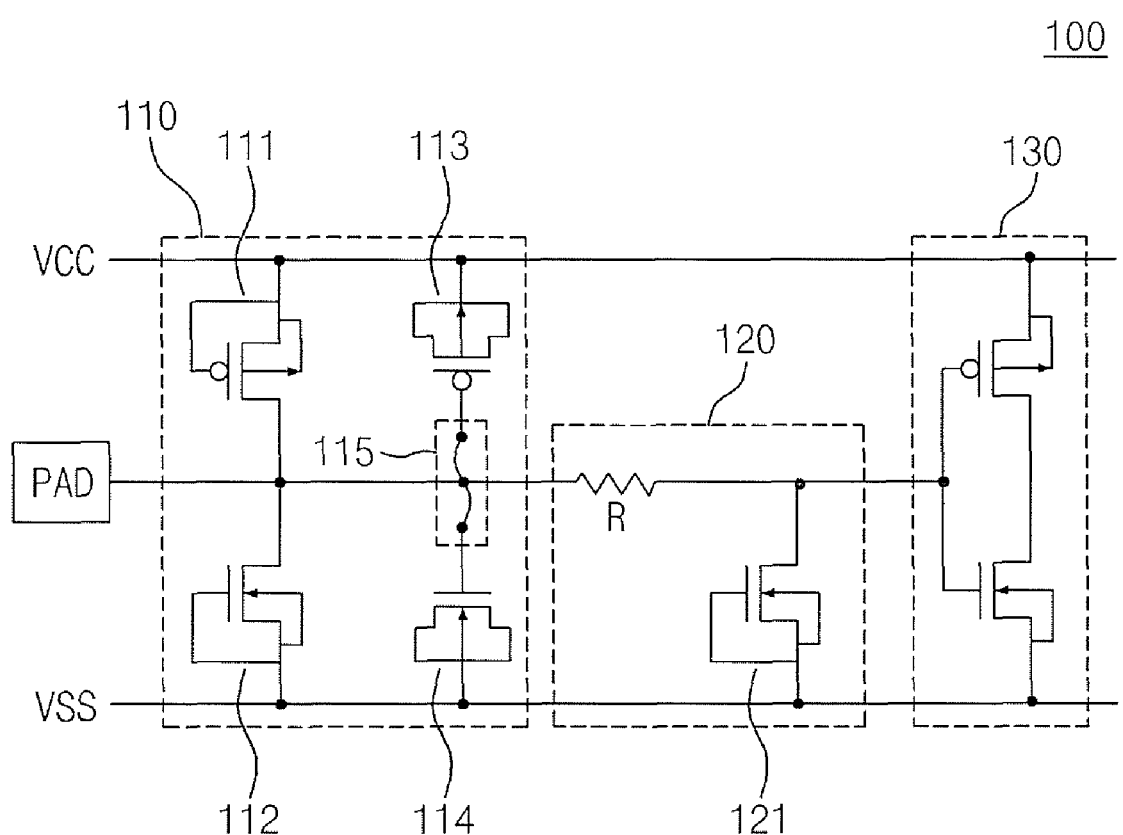
FIG. 3 is a detailed circuit diagram showing an electrostatic discharge device according to one embodiment of the present invention.

FIG. 3 is a circuit diagram of an electrostatic discharge device according to one embodiment of the present invention. The circuit diagram of FIG. 3 is a detailed circuit diagram of FIG. 2.

Referring to FIG. 3, the electrostatic discharging unit 110 includes a PMOS transistor 111 and an NMOS transistor 112 that discharges static electricity to the power source voltage Vcc line and the ground voltage Vss line respectively if the static electricity is induced at the pad.

The PMOS transistor 111 and the NMOS transistor 112 operate as a diode since they have a gate terminal and a source terminal shorted respectively. Therefore, the PMOS transistor 111 is referred to as 'PMOS diode' and the NMOS transistor 112 is referred to as 'NMOS diode'.

The electrostatic discharging unit 110 further includes a PMOS capacitor 113 and an NMOS capacitor 114 in which a source terminal and a drain terminal are connected to ensure the pin capacitance. The PMOS capacitor 113 and the NMOS capacitor 114 are connected to a node connected to the pad PAD by a metal option 115 of a switching device.

Therefore, if it is necessary to ensure the pin capacitance in the electrostatic discharge device, the metal option 115 maintains a connection state, i.e., is not cut, so that the PMOS capacitor 113 and the NMOS capacitor 114 are connected to the node connected to the pad PAD. Where the metal option 115 is turned on, i.e., not cut, the PMOS diode 111, the NMOS diode 112, the PMOS capacitor 113, and the NMOS capacitor 114 are connected to the same node connected to the pad PAD.

Preferably, the PMOS and NMOS diodes 111, 112 and the PMOS and NMOS capacitors 113, 114 are formed as a finger-structured transistor, respectively.

The protection unit 120 includes a resistance element R connected between a node connected to the pad PAD and the input buffer 130, and an NMOS diode 121 connected to the resistance element R. The NMOS diode 121 is connected in parallel to the input buffer 130. The NMOS diode 121 is structured such that one terminal of the NMOS diode 121 is connected to the ground voltage Vss line.

Figure 4:
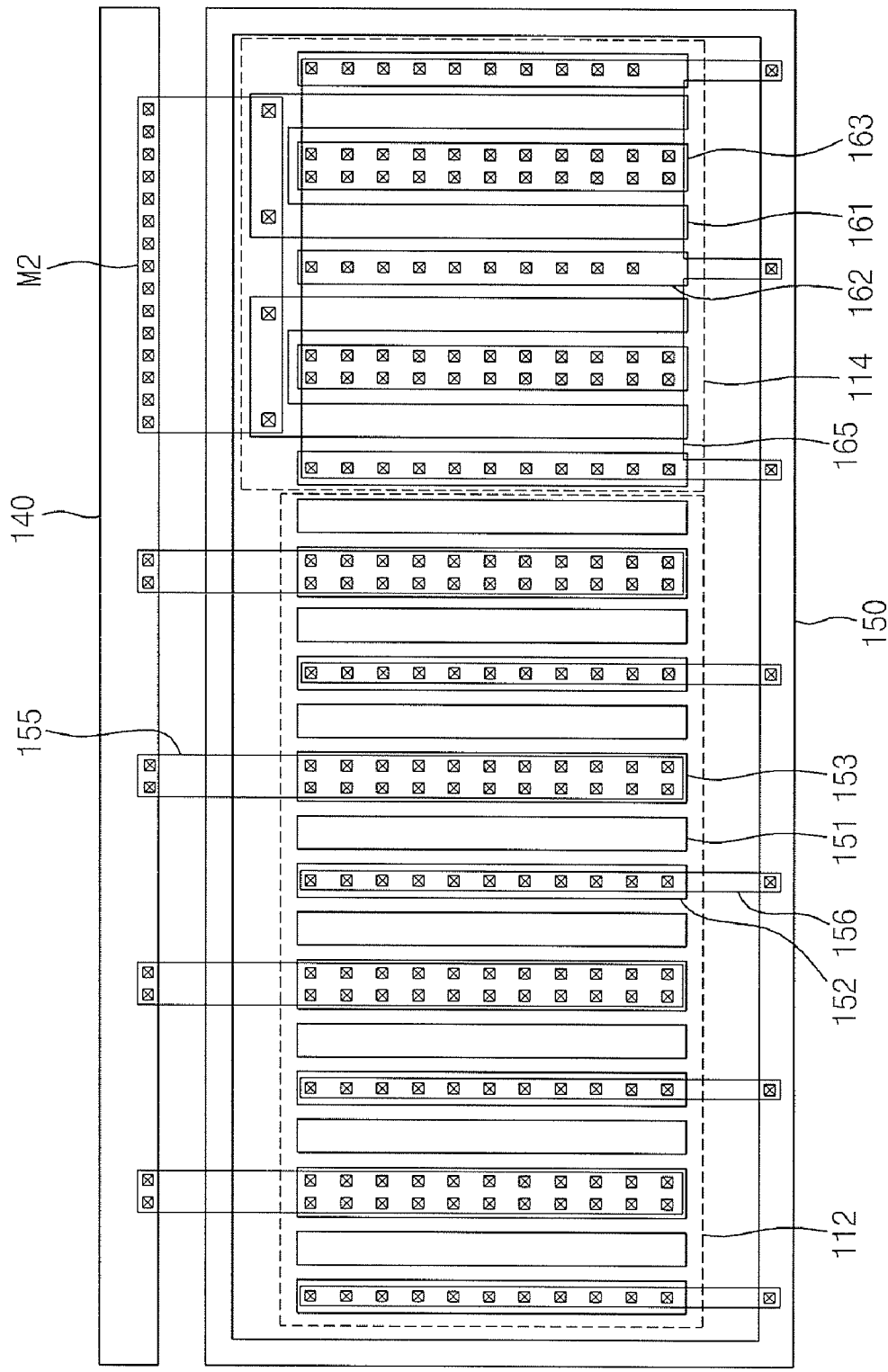
FIG. 4 is a layout diagram showing one embodiment of an NMOS transistor of FIG. 3.

A layout of the NMOS diode 112 and the NMOS capacitor 114 of FIG. 3 is shown in FIG. 4. A layout of the PMOS diode 111 and the PMOS capacitor 113 of FIG. 3 can be implemented substantially similar to the layout of FIG. 4 so as to be in an opposite polarity while being symmetrical to the layout of FIG. 4.

Referring to FIG. 4, a pad line 140 connected to the pad is formed. An element separation film 150 and guard ring (not shown) are stacked and provided on one side of the pad line 140. The NMOS capacitor 112 and the NMOS capacitor 114, having the finger structure, are formed within the element separation film 150 and guard ring such that the element separation film 150 and guard ring surround the NMOS capacitor 112 and the NMOS capacitor 114.

The NMOS diode 112 has a source 152 and a drain 153 formed with a gate 151 as a center. The drain 153 is connected to the pad line 140 via a contact and connection pattern 155. The source 152 is connected to the guard ring and the ground voltage via the contact and connection pattern 156. The labeling of the remaining portions of FIG. 4 is omitted since the NMOS diode 112 has the finger structure and repeats the same pattern.

Meanwhile, the NMOS capacitor 114 has a finger structure similar to that of the NMOS diode 112. The NMOS capacitor 114 has gates 161 that are connected to each other and are further connected to the pad line 140 through the contacts and metal option M2. The source 162 and the drain 163 are formed on both sides of each gate 161. The sources and the drains of the NMOS diode 112 are connected to the guard ring and the ground voltage via the connection pad 165.

As described above, an additional capacitance can be effectively utilized by means of the metal option 115, M2, if necessary since the capacitor included in the electrostatic discharging unit 110 of the electrostatic discharge device shown in FIG. 3 can be designed as shown in FIG. 4.

Figure 5:
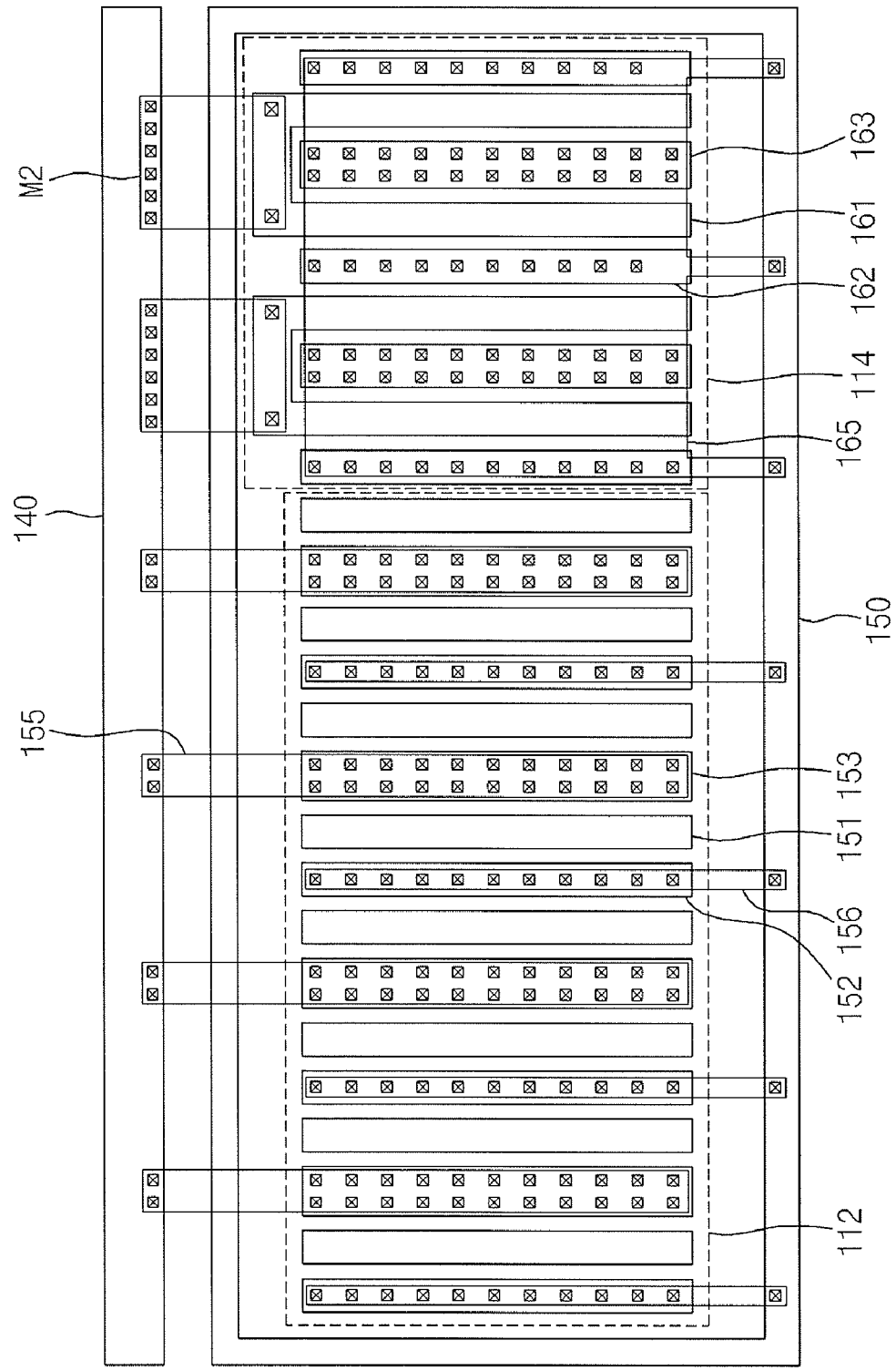
FIGS. 5 to 7 are layout diagrams showing another embodiment of the NMOS transistor of FIG. 3.

The metal option M2 shown in FIG. 4 may also be implemented as divided metal options M2 for the electrostatic discharge unit 110 as shown in FIG. 5. As shown in FIG. 5, the electrostatic discharging unit 110 can control the amount of additional capacitance according to the number of metal options M2 selected. That is, selectively cutting or retaining the divided metal options M2 can more effectively control the amount of additional capacitance.

Figure 6:
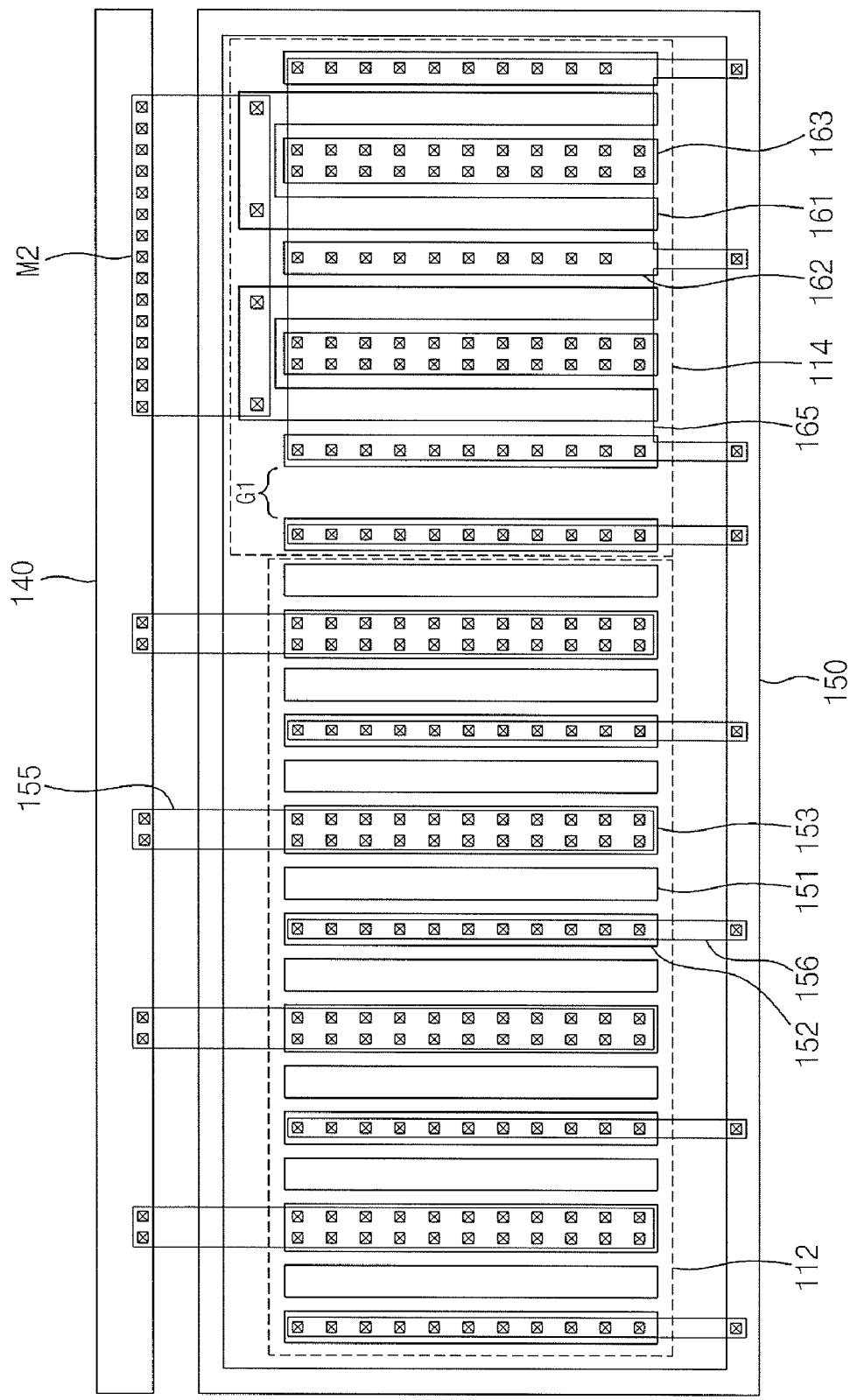
Figure 7:
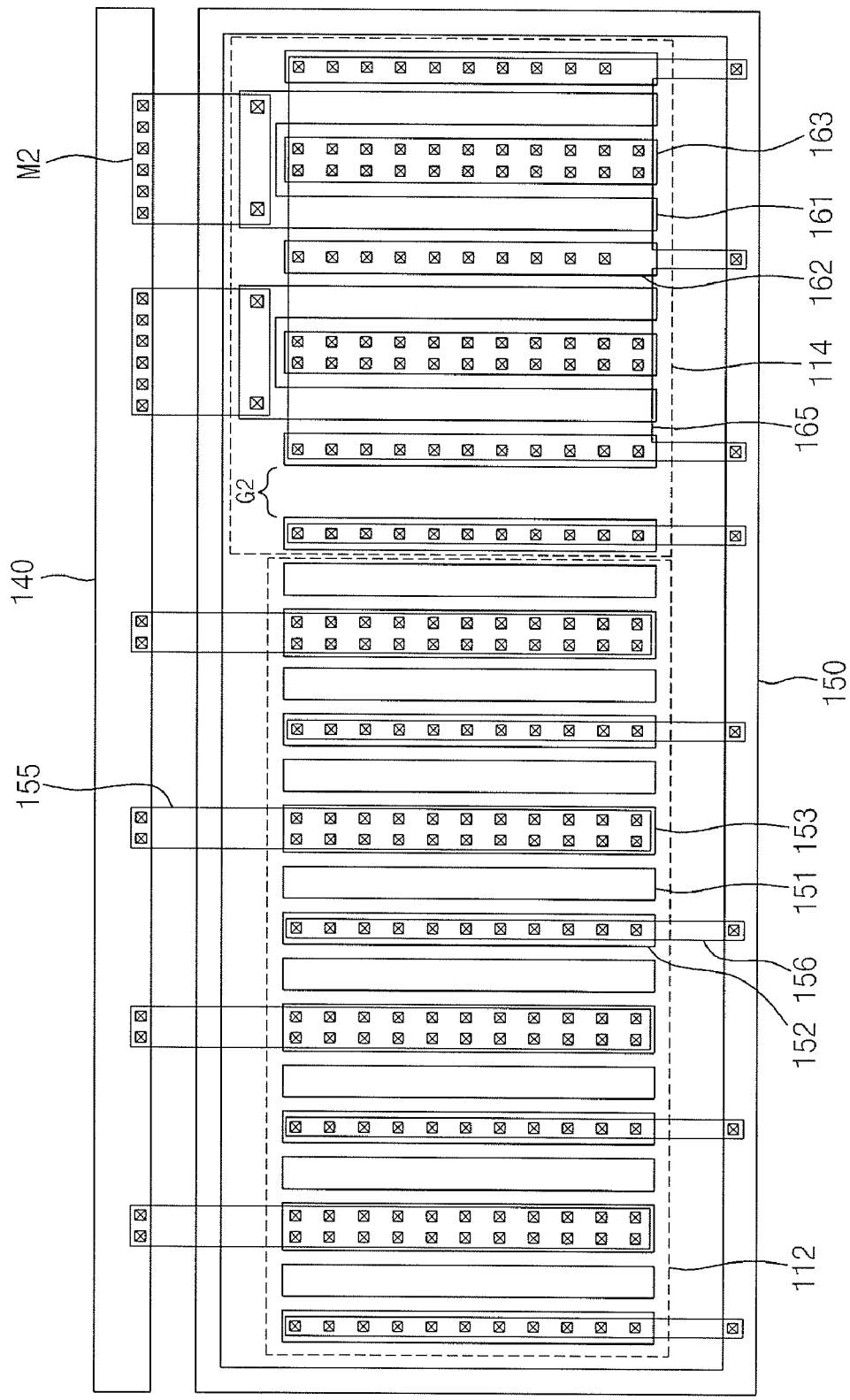

Further, referring to the embodiment of FIG. 4 and FIG. 5, the finger-structured transistor diode and the finger-structured transistor capacitor can be formed separately from each other so as to have gaps G1, G2 as shown in FIG. 6 and FIG. 7, respectively.

Figure 8:
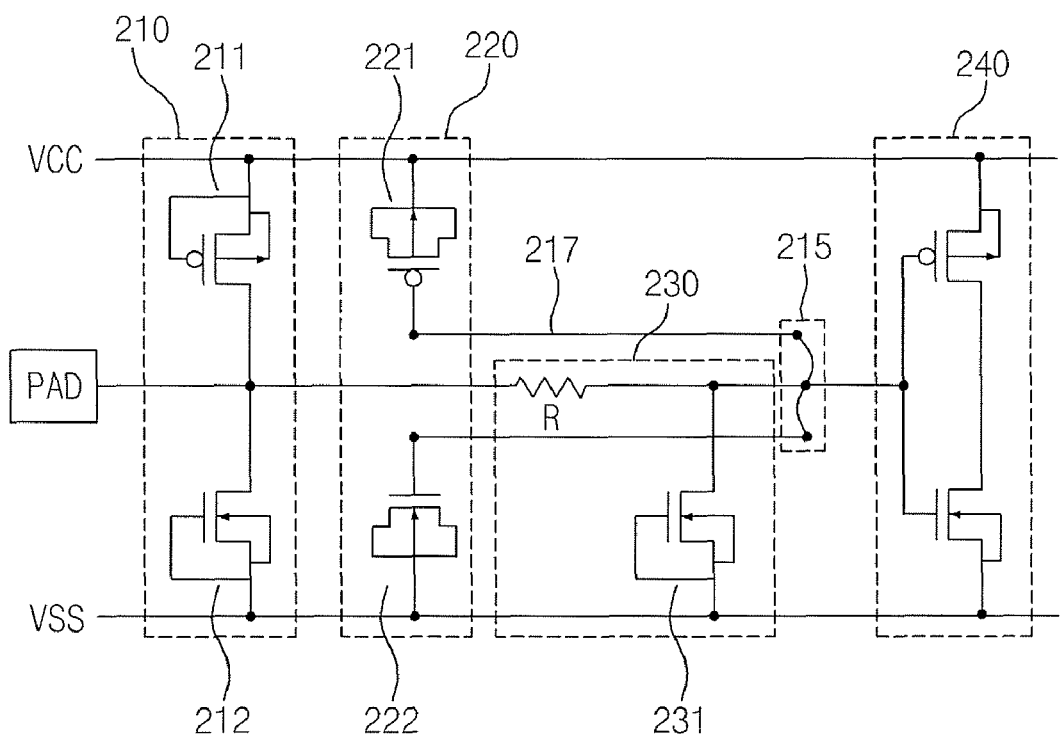
FIG. 8 is a detailed circuit diagram of an electrostatic discharge device according to another embodiment of the present invention.
Figure 9:
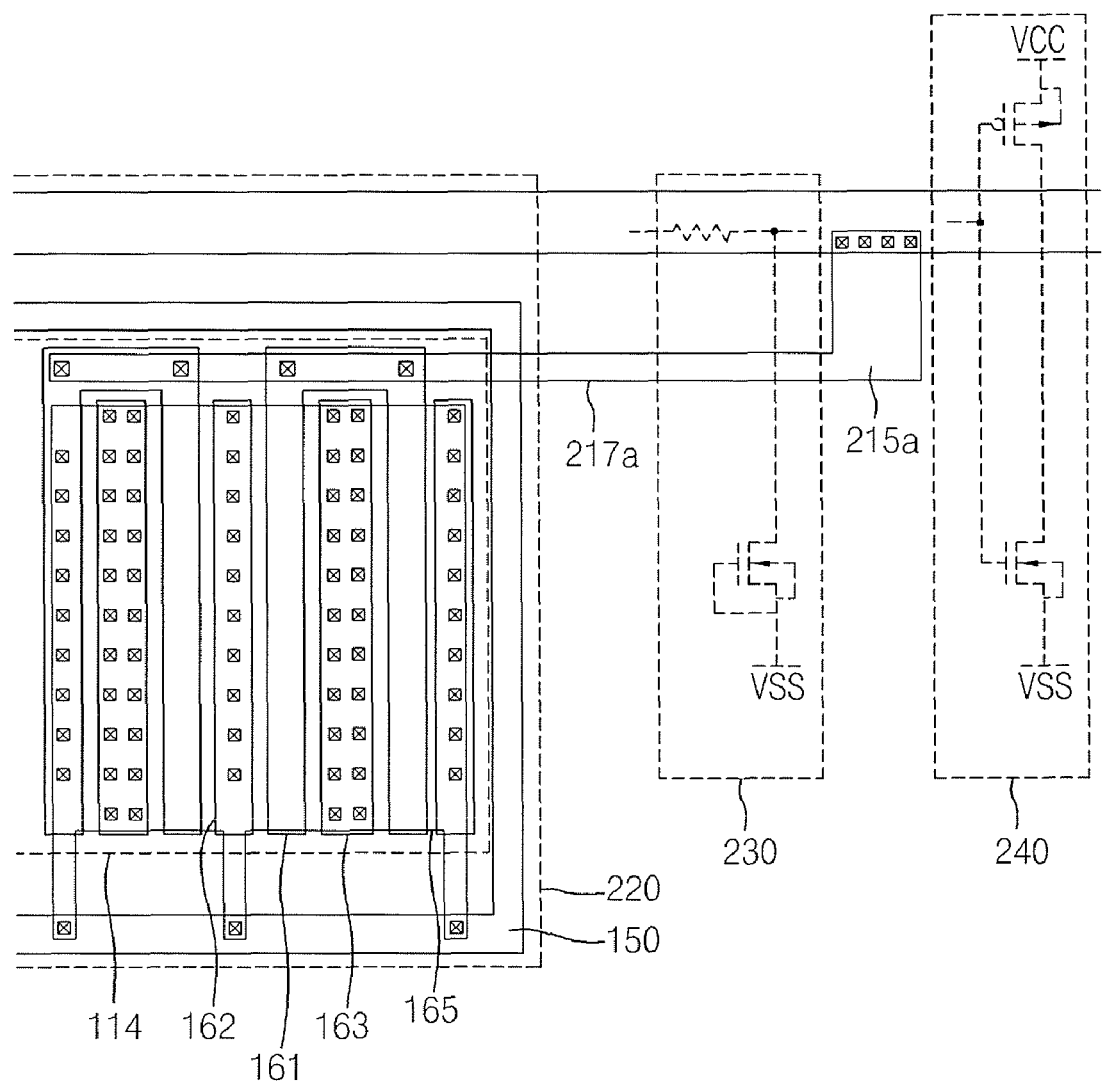
FIG. 9 is a layout diagram showing an embodiment of an NMOS transistor of FIG. 8.

Meanwhile, as shown in FIG. 8, the metal option 115 of FIG. 3 may be embodied as the metal option 215 of the capacitor unit 220, which is located adjacent to the diode unit 210. The metal option 215 includes an option metal 217 extended beyond the transistor 231 of the protection unit 230 as shown in FIG. 8 and FIG. 9. An option head 215a is formed at an end portion of the option pad 217a to contact the pad line as shown in FIG. 9.

The reference numeral 217 of FIG. 8 corresponds to the option pad 217a of FIG. 9. The reference numeral 240 corresponds to a buffer circuit, the transistors 211, 212 correspond to diodes 111, 112 of FIG. 3, and the transistors 221, 222 correspond to capacitors 113, 114 of FIG. 3.

The metal option 215 structured as shown in FIG. 8 and FIG. 9 may be used if there is an increased danger of destroying the gate oxide of the finger-structured capacitor.

With reference to FIG. 3, the embodiments of FIGS. 4-7 have the pad line and the node formed on the pad-side of the protection unit 120 when the metal option is connected, whereas in the embodiments of FIG. 8 and FIG. 9 the node of the metal option 215 is formed on the input buffer-side of the protection unit 230. That is, using the protection unit 120, 230 as a central reference point for the formation of the metal option 115, 215, in FIGS. 4-7 the metal option 115 is formed on the pad PAD side of the protection unit 120, while in FIGS. 8-9 the metal option 215 is formed on the buffer circuit 240 side of the protection unit 230.

Referring to the embodiment of FIG. 8, if current flows through the resistance element R of the protection unit 230 due to static electricity, a voltage drop is generated and thus a voltage applied to the gate oxide is lowered. It is thereby possible to protect the gate oxide from being destroyed by the current from the static electricity.

In addition, it is possible to ensure the pin capacitance while having a smaller area since the capacitor unit 220 has the finger structure and is in a position similar to that of FIG. 3.

As explained above, according to the present invention, it is possible to reduce the chip size and also easily ensure the pin capacitance. The pin capacitance is ensured via the metal option using the finger structure by forming, within the electrostatic discharging unit, the capacitor that was conventionally formed outside the electrostatic discharging unit for ensuring the pin capacitance.

Further, it is possible to protect against the destroying of the gate oxide film by providing the connection node of the metal option at an end of the CDM resistor element and before the internal circuit.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. An electrostatic discharge device, comprising:
   an electrostatic discharging unit formed between a power source voltage line and a ground voltage line to discharge static electricity inputted at a pad;
   the electrostatic discharging unit includes a MOS capacitor having a gate terminal coupled to the pad via a metal option; and
   a protection unit formed between the electrostatic discharging unit and the ground voltage line to protect an internal circuit from static electricity stored in the electrostatic discharging unit,
   wherein the MOS capacitor comprises:
      a first capacitor having a source and a drain coupled to the power source voltage line; and
      a second capacitor having a source and a drain coupled to the ground voltage line, and
      wherein the first capacitor and the second capacitor are formed to have a finger structure.

2. The electrostatic discharge device as set forth in claim 1, wherein the first capacitor is a PMOS capacitor and the second capacitor is an NMOS capacitor.

3. The electrostatic discharge device as set forth in claim 1, wherein the protection unit comprises:
   a resistance element coupled to the pad and an NMOS transistor,
   wherein the NMOS transistor is also coupled to the ground voltage line.

4. An electrostatic discharge device, comprising:
   an electrostatic discharging unit formed between a power source voltage line and a ground voltage line to discharge static electricity inputted at a pad;
   the electrostatic discharging unit includes a MOS capacitor having a gate terminal coupled to the pad via a metal option; and
   a protection unit formed between the electrostatic discharging unit and the ground voltage line to protect an internal circuit from the static electricity stored in the electrostatic discharging unit,
   wherein the metal option has a pattern formed proximate to the internal circuit such that an option head of the metal option is formed between the protection unit and the internal circuit, and the metal option is coupled to a node that is coupled to the pad.

5. The electrostatic discharge device as set forth in claim 4, wherein the MOS capacitor comprises:
   a first capacitor having a source and a drain coupled to the power source voltage line; and a second capacitor having a source and a drain coupled to the ground voltage line.

6. The electrostatic discharge device as set forth in claim 5, wherein the first capacitor is a PMOS capacitor and the second capacitor is an NMOS capacitor.

7. The electrostatic discharge device as set forth in claim 5, wherein the first capacitor and the second capacitor are formed to have a finger structure.

8. The electrostatic discharge device as set forth in claim 4, wherein the protection unit comprises:
 a resistance element coupled to the pad and an NMOS transistor,
 wherein the NMOS transistor is also coupled to the ground voltage line.

* * * * *